US012573993B2

(12) United States Patent
Hoversten et al.

(10) Patent No.: US 12,573,993 B2
(45) Date of Patent: Mar. 10, 2026

(54) PULSE-SHAPING NETWORKS WITH COUPLED MAGNETICS

(71) Applicant: Murata Manufacturing Co., Ltd., Kyoto (JP)

(72) Inventors: John R. Hoversten, Arlington, MA (US); David J. Perreault, Cambridge, MA (US); Yevgeniy A. Tkachenko, Belmont, MA (US)

(73) Assignee: Murata Manufacturing Co., Ltd., Kyoto (JP)

( * ) Notice: Subject to any disclaimer, the term of this patent is extended or adjusted under 35 U.S.C. 154(b) by 445 days.

(21) Appl. No.: 18/185,832

(22) Filed: Mar. 17, 2023

(65) Prior Publication Data

US 2024/0136991 A1 Apr. 25, 2024

Related U.S. Application Data

(60) Provisional application No. 63/378,563, filed on Oct. 6, 2022.

(51) Int. Cl.
*H03F 9/04* (2006.01)

(52) U.S. Cl.
CPC ......... *H03F 9/04* (2013.01); *H03F 2200/555* (2013.01)

(58) Field of Classification Search
CPC .............................. H03F 9/04; H03F 2200/555
USPC ........................................................ 330/127
See application file for complete search history.

(56) References Cited

U.S. PATENT DOCUMENTS

| | | | |
|---|---|---|---|
| 3,517,299 A | 6/1970 | Corry | |
| 5,710,520 A | 1/1998 | Frey | |

| | | | |
|---|---|---|---|
| 6,658,053 B1 | 12/2003 | Aiello et al. | |
| 7,103,114 B1 | 9/2006 | Lapierre | |
| 7,482,869 B2 | 1/2009 | Wilson | |
| 7,746,041 B2 | 6/2010 | Xu et al. | |
| 7,777,459 B2 | 8/2010 | Williams | |
| 7,782,027 B2 | 8/2010 | Williams | |

(Continued)

FOREIGN PATENT DOCUMENTS

| | | |
|---|---|---|
| CN | 1825757 A | 8/2006 |
| CN | 103873007 A | 6/2014 |

(Continued)

OTHER PUBLICATIONS

Cao, et al.; "A Family of Zero Current Switching Switched-Capacitor DC-DC Converters"; 2010 Twenty-Fifth Annual IEEE Applied Power Electronics Conference and Exposition (APEC); Feb. 21-25, 2010; 8 Pages.

(Continued)

*Primary Examiner* — Hafizur Rahman

(74) *Attorney, Agent, or Firm* — Daly, Crowley, Mofford & Durkee, LLP

(57) ABSTRACT

A pulse-shaping network configured for use in a radio frequency (rf) power amplifier system, the pulse-shaping network comprising: a coupled magnetic element comprising a first inductive element magnetically coupled to a second inductive element, the first inductive element comprising a first winding disposed about a first portion of a core, and the second inductive element comprising a second winding disposed about a second portion of a core, wherein the first and second inductive elements are electrically coupled to provide three output terminals of the coupled magnetic element.

22 Claims, 10 Drawing Sheets

(56) References Cited

U.S. PATENT DOCUMENTS

| | | | |
|---|---|---|---|
| 7,786,712 B2 | 8/2010 | Williams | |
| 7,812,579 B2 | 10/2010 | Williams | |
| 7,977,927 B2 | 7/2011 | Williams | |
| 8,026,763 B2 | 9/2011 | Dawson et al. | |
| 8,164,384 B2 | 4/2012 | Dawson et al. | |
| 8,212,541 B2 | 7/2012 | Perreault et al. | |
| 8,633,766 B2 | 1/2014 | Khlat et al. | |
| 8,718,188 B2 | 5/2014 | Balteanu et al. | |
| 8,824,978 B2 | 9/2014 | Briffa et al. | |
| 8,829,993 B2 | 9/2014 | Briffa et al. | |
| 8,830,709 B2 | 9/2014 | Perreault et al. | |
| 8,830,710 B2 | 9/2014 | Perreault et al. | |
| 8,860,396 B2 | 10/2014 | Giuliano | |
| 8,957,727 B2 | 2/2015 | Dawson et al. | |
| 8,981,847 B2 | 3/2015 | Balteanu | |
| 9,020,453 B2 | 4/2015 | Briffa et al. | |
| 9,160,287 B2 | 10/2015 | Briffa et al. | |
| 9,166,536 B2 | 10/2015 | Briffa et al. | |
| 9,172,336 B2 | 10/2015 | Briffa et al. | |
| 9,209,758 B2 | 12/2015 | Briffa et al. | |
| 9,479,126 B2 | 10/2016 | Ilkov et al. | |
| 9,490,752 B2 | 11/2016 | Briffa et al. | |
| 9,531,291 B2 | 12/2016 | Perreault | |
| 9,537,456 B2 | 1/2017 | Briffa et al. | |
| 9,590,565 B2 | 3/2017 | Yuzurihara et al. | |
| 9,634,577 B2 | 4/2017 | Perreault | |
| 9,668,215 B2 | 5/2017 | Balteanu et al. | |
| 9,755,672 B2 | 9/2017 | Perreault et al. | |
| 9,768,731 B2 * | 9/2017 | Perreault | H04B 1/0475 |
| 9,768,732 B2 | 9/2017 | Briffa et al. | |
| 9,917,517 B1 | 3/2018 | Jiang et al. | |
| 9,979,421 B2 | 5/2018 | Astrom et al. | |
| 9,991,043 B2 * | 6/2018 | Andres | H01F 27/323 |
| 9,991,913 B1 | 6/2018 | Dinur et al. | |
| 10,164,577 B2 | 12/2018 | Briffa et al. | |
| 10,193,441 B2 | 1/2019 | Giuliano | |
| 10,291,184 B1 | 5/2019 | Sutskover et al. | |
| 10,348,251 B2 | 7/2019 | Ishiwata et al. | |
| 10,389,235 B2 | 8/2019 | Giuliano | |
| 10,658,981 B2 | 5/2020 | Briffa et al. | |
| 10,749,476 B2 | 8/2020 | Sutskover et al. | |
| 10,862,428 B2 | 12/2020 | Henzler et al. | |
| 10,958,218 B2 | 3/2021 | Gebeyehu et al. | |
| 10,979,007 B2 | 4/2021 | Cho et al. | |
| 10,992,265 B2 * | 4/2021 | Hoversten | H03F 3/245 |
| 11,043,918 B2 | 6/2021 | Tanaka et al. | |
| 11,191,028 B2 | 11/2021 | Hoversten et al. | |
| 11,245,367 B2 | 2/2022 | Garrett et al. | |
| 11,558,014 B2 | 1/2023 | Tanaka et al. | |
| 11,637,531 B1 | 4/2023 | Perreault et al. | |
| 11,664,727 B2 * | 5/2023 | Giuliano | H02M 3/07 323/267 |
| 11,736,010 B2 | 8/2023 | Giuliano et al. | |
| 11,757,410 B2 | 9/2023 | Hoversten et al. | |
| 11,757,411 B2 | 9/2023 | Tanaka et al. | |
| 2006/0178119 A1 | 8/2006 | Jarvinen | |
| 2006/0198466 A1 | 9/2006 | Wright et al. | |
| 2008/0019459 A1 | 1/2008 | Chen et al. | |
| 2010/0073084 A1 | 3/2010 | Hur et al. | |
| 2012/0163489 A1 | 6/2012 | Ramakrishnan | |
| 2014/0057684 A1 | 2/2014 | Khlat | |
| 2014/0086301 A1 | 3/2014 | Akhavan et al. | |
| 2015/0068421 A1 | 3/2015 | Kreß et al. | |
| 2015/0139362 A1 | 5/2015 | Lee et al. | |
| 2016/0050629 A1 | 2/2016 | Khesbak et al. | |
| 2018/0123458 A1 | 5/2018 | Paek et al. | |
| 2018/0198416 A1 | 7/2018 | Hur et al. | |
| 2018/0241350 A1 | 8/2018 | Leipold et al. | |
| 2018/0316311 A1 | 11/2018 | Gebeyehu et al. | |
| 2018/0331659 A1 | 11/2018 | Khesbak et al. | |
| 2019/0103217 A1 | 4/2019 | Pallesgaard | |
| 2020/0313621 A1 | 10/2020 | Hoversten et al. | |
| 2021/0288614 A1 | 9/2021 | Hoversten et al. | |
| 2021/0385752 A1 | 12/2021 | Hoversten et al. | |
| 2022/0103066 A1 | 3/2022 | Chen et al. | |
| 2022/0131463 A1 | 4/2022 | Giuliano et al. | |
| 2022/0149725 A1 | 5/2022 | Garrett et al. | |
| 2023/0054485 A1 | 2/2023 | Hoversten et al. | |
| 2023/0056740 A1 | 2/2023 | Perreault et al. | |
| 2023/0057037 A1 | 2/2023 | Hoversten et al. | |

FOREIGN PATENT DOCUMENTS

| | | |
|---|---|---|
| CN | 104485917 A | 12/2017 |
| JP | H0294628 | 4/1990 |
| JP | H 10-294628 A | 11/1998 |
| JP | 2015-507452 A | 3/2015 |
| JP | 2015-138560 | 7/2015 |
| WO | WO 2012/148918 | 11/2012 |
| WO | WO 2013/126610 | 8/2013 |
| WO | WO2014/046806 92 | 3/2014 |
| WO | WO 2017/006688 | 1/2017 |

OTHER PUBLICATIONS

Cao, et al.; "Multiphase Multilevel Modulator DC-DC Converter for High-Current High-Gain TEG Application"; IEEE Transactions on Industry Application; vol. 47; No. 3; May/Jun. 2011; 9 Pages.

Chen, et al.; "A High Efficiency High Power Step-Up Resonant Switched-Capacitor"; 2012 IEEE Energy Conversion Congress and Exposition (ECCE); Sep. 15-20, 2012; 5 Pages.

Shoyama, et al.; "Resonant Switched Capacitor Converter with High Efficiency"; 2004 35th Annual IEEE Power Electronics Specialists Conference; 2004; 7 Pages.

Sun, et al.; "High Power Density, High Efficiency System Two-Stage Power Architecture for Laptop Computers"; 2006 37th IEEE Power Electronics Specialists Conference; Jun. 18-22, 2006; 7 Pages.

Unknown; "Fundamentals of Power Electronics"; Chapter 19: Resonant Conversion; Sep. 19, 2019; 87 Pages.

Yeung, et al.; "Multiple and Fractional Voltage Conversion Ratios for Switched-capacitor Resonant Converters"; 2001 IEEE 32nd Annual Power Electronics Specialists Conference (IEEE Cat. No. 01CH37230); Jun. 17-21, 2001; 6 Pages.

Restriction Requirement dated May 14, 2025, for U.S. Appl. No. 18/048,075; 6 pages.

Restriction Requirement dated May 14, 2025, for U.S. Appl. No. 18/048,075; Response filed Jun. 20, 2025; 2 pages.

PCT International Search Report and Written Opinion dated Feb. 9, 2024 for International Patent Application No. PCT/US2023/075689; 11 pages.

Japanese Office Action (with English Translation) dated May 16, 2023, for Japanese Application No. 2021-560322; 16 pages.

Japanese Office Action dated May 16, 2023, for Japanese Application No. 2021-560322; Response (with English Translation) filed on Oct. 19, 2023; 17 pages.

Japanese Office Action (with English Translation) dated Jan. 12, 2024, for Japanese Application No. 2021-560322; 13 pages.

Japanese Office Action dated Jan. 12, 2024, for Japanese Application No. 2021-560322; Response (with English Translation) filed on May 13, 2024; 10 pages.

Korean Office Action (with English Translation) dated Aug. 21, 2023, for Korean Application No. 10-2021-7034756; 24 pages.

Korean Office Action dated Aug. 21, 2023, for Korean Application No. 10-2021-7034756; Response (with English Translation) filed on Oct. 17, 2023; 72 pages.

Korean Office Action (with English Translation) dated Feb. 26, 2024, for Korean Application No. 10-2021-7034756; 17 pages.

Korean Office Action dated Feb. 26, 2024, for Korean Application No. 10-2021-7034756; Response (with English Translation) filed Jun. 24, 2024; 140 pages.

Communication Pursuant to Article 94(3) EPC dated Dec. 6, 2024, for European Application No. 20784025.7; Response filed Jun. 5, 2025; 19 pages.

Chinese Office Action dated Dec. 27, 2024, for Chinese Application No. 202080039255.2; 27 pages w/English translation.

(56)　　　　　References Cited

OTHER PUBLICATIONS

Chinese Office Action dated Dec. 27, 2024, for Chinese Application No. 202080039255.2; Response filed May 16, 2025; 16 pages w/English translation.

Choi et al., "A ΔΣ-Digitized Polar RF Transmitter;" IEEE Transactions on Microwave Theory and Techniques, vol. 55, No. 12, pp. 2679-2690, published Dec. 2007; 12 pages.

F.H. Raab, "Average Efficiency of Class-G Power Amplifiers," IEEE Transactions on Consumer Electronics, vol. CE-32, No. 2, pp. 145-150, published Apr. 7, 1986; 6 pages.

Godoy et al., "A 2.4-GHz, 27-dBm Asymmetric Multilevel Outphasing Power Amplifier in 65-nm CMOS;" IEEE Journal of Solid-State Circuits, vol. 47, No. 10, pp. 2372-2384, published Oct. 2012; 13 pages.

Vasic et al., "Multilevel Power Supply for High Efficiency RF Amplifiers;" 2009 IEEE Applied Power Electronics Conference, pp. 1233-1238, published Feb. 2009; 6 pages.

Walling et al., "A Class-G Supply Modulator and Class-E PA in 130nm CMOS;" IEEE Journal of Solid-State Circuits, vol. 44, No. 9, pp. 2339-2347, published Sep. 2009; 9 pages.

European Examination Report dated Dec. 6, 2024 for European Application No. 20 784 025.7-1201; 12 Pages.

Extended European Search Report dated Dec. 9, 2022 for European Application No. 20784025.7; 16 pages.

International Preliminary Report on Patentability dated Oct. 14, 2021 for International Patent Application No. PCT/US2020/021976; 1 pages.

International Search Report dated Jun. 12, 2020 for International Application No. PCT/US2020/021976; 10 pages.

Japanese Appeal Brief (with English Translation) dated Jun. 20, 2024 for Japanese Application No. 2021-560322; 14 Pages.

Japanese Notice of Allowance (with English Translation) dated Oct. 1, 2024 for Japanese Application No. 2021-560322; 5 Pages.

Korean Notice of Allowance (with English translation of Allowed Claims) dated Jul. 29, 2024 for Korean Patent Application No. 10-2021-7034756; 6 pages.

Non-Final Office Action dated Feb. 24, 2023 for U.S. Appl. No. 17/216,919; 8 pages.

Non-Final Office Action dated May 10, 2022 for U.S. Appl. No. 17/216,919; 10 pages.

Notice of Allowance dated Nov. 17, 2022 for U.S. Appl. No. 17/216,919; 8 pages.

Response to U.S. Office Action dated Feb. 24, 2023 for U.S. Appl. No. 17/216,919 as filed on Apr. 12, 2023; 6 pages.

Response to U.S. Office Action dated May 10, 2022 for U.S. Appl. No. 17/216,919; Response filed on Sep. 12, 2022; 10 pages.

Non-Final Office Action dated Sep. 2, 2020 for U.S. Appl. No. 16/369,667; 12 Pages.

Notice of Allowance dated Mar. 3, 2021 for U.S. Appl. No. 16/369,667; 9 Pages.

Response to U.S. Office Action dated Sep. 2, 2022 for U.S. Appl. No. 16/369,667 as filed on Nov. 23, 2020; 12 pages.

PCT International Preliminary Report on Patentability dated May 1, 2025 for International Application No. PCT/US2023/063820; 9 Pages.

Response to Office Action dated Aug. 27, 2025, for U.S. Appl. No. 18/048,075; Response filed Nov. 25, 2025; 6 pages.

* cited by examiner

400

500

Coupled magnetic windings

PULSE-SHAPING NETWORKS WITH COUPLED MAGNETICS

CROSS REFERENCE SECTION

This application claims the benefits of U.S. Provisional Application No. 63/378,563, filed on Oct. 6, 2022. The entire contents of this application is incorporated herein by reference.

FIELD

This disclosure relates generally to pulse-shaping networks, and more particularly to pulse-shaping networks with coupled magnetics.

BACKGROUND

As is known in the art, so-called "discrete" supply modulation systems (also sometimes referred to as discrete "drain modulation"), a supply voltage is switched among a set of discrete voltage levels, possibly including additional filtering through a filter circuit (sometimes referred to as a "pulse shaping network" or PSN), to shape the voltage transitions among the set of set of discrete voltage levels. Systems of this type may include, for example, "class G" amplifiers, multi-level LINC (MLINC) power amplifiers, asymmetric multilevel outphasing (AMO) power amplifiers, multilevel backoff amplifiers (including asymmetric multilevel backoff amplifiers) and digitized polar transmitters among other types.

The filter circuits (e.g., the aforementioned PSNs) contain magnetic components such as inductors to provide high-efficiency filtering. The inclusion of such magnetic components results in pulse shaping networks being relatively large and costly components.

SUMMARY

In accordance with one aspect of the concepts, systems and techniques described herein, the inventors have recognized that filter circuits (e.g., pulse shaping networks) containing magnetic components (e.g. inductors) to provide high-efficiency filtering pose a challenge to realizing highly miniature discrete drain modulation systems and pulse shaping networks in particular, because they are relatively large and costly components.

To address this challenge, described herein are concepts, systems and techniques directed toward reducing a size of magnetic components (e.g. inductor components and filter circuits (such as pulse-shaping networks) which include magnetic components. Thus, in accordance with one aspect of the concepts described herein, a magnetic element comprises a first inductive element magnetically coupled to a second inductive element. The first inductive element includes a first winding disposed about a first portion of a core and the second inductive element includes a second winding disposed about a second portion of a core with the first and second inductive elements electrically coupled to provide three output terminals of the coupled magnetic element. With this particular arrangement, a multi-winding magnetic component is provided. Such a multi-winding magnetic component may be used in any application in which it is desirable to integrate a magnetic component together with other electronics on a single semiconductor die (e.g., in a CMOS or BCD process) or an integrated circuit (IC). For example, this approach may be desirable to use in mobile applications (e.g. mobile handsets).

In accordance with a further aspect of the concepts described herein, a pulse-shaping network configured for use in a radio frequency (rf) power amplifier system, the pulse-shaping network includes a coupled magnetic element comprising a first inductive element magnetically coupled to a second inductive element. The first inductive element includes a first winding disposed about a first portion of a core and the second inductive element includes a second winding disposed about a second portion of a core with the first and second inductive elements electrically coupled to provide three output terminals of the coupled magnetic element.

With this particular arrangement, a pulse shaping network (or more generally filter circuits) appropriate for use in a variety of applications and which is smaller than conventional pulse shaping networks is provided. Such applications including radio frequency (rf) power amplifier systems such as may be used in an rf module for a mobile handset, for example.

The concepts, systems and techniques described herein may further be used to provide discrete drain modulation systems which are smaller than (i.e. miniaturized relative to) conventional discrete drain modulation systems. Such miniaturized discrete drain modulation systems may include miniaturized pulse shaping networks (i.e., pulse shaping networks smaller than conventional pulse shaping networks).

BRIEF DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which.

DETAILED DESCRIPTION

Figure 1:
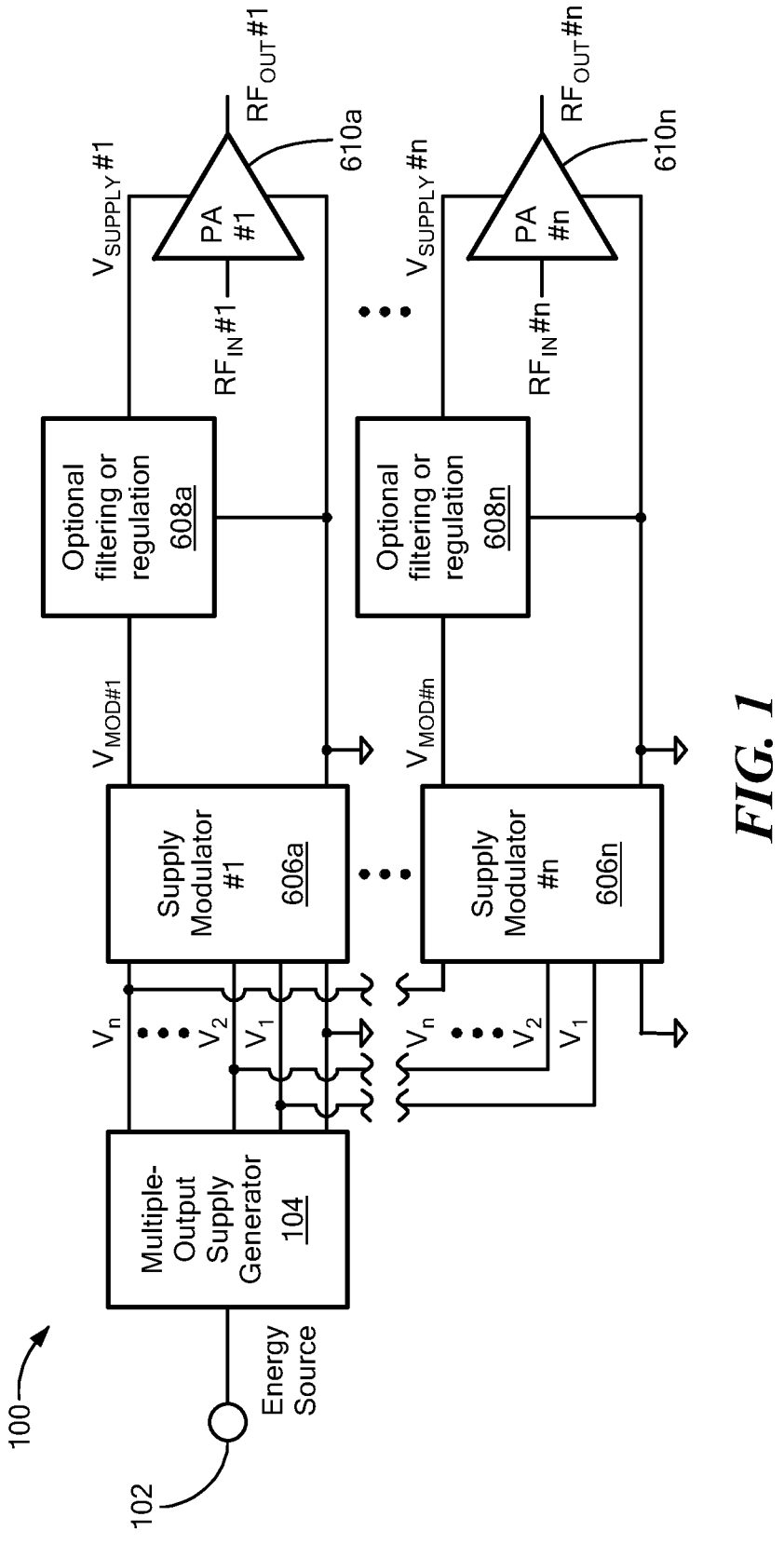
FIG. 1 is a block diagram of an exemplary radio frequency (rf) power amplifier system utilizing multiple supply levels and supplying multiple power amplifiers.

Referring now to FIG. 1, an exemplary rf amplifier system 100 is configured to utilize multiple supply levels $V_1$-$V_n$. The system 100 includes an energy source 102 that provides power to a multiple-output supply generator 104 that is configured to provide the supply levels (e.g., supply voltages). The system 100 includes a plurality of supply modulators 106$a$-$n$ and an optional plurality of filtering and/or regulation circuitry 108$a$-$n$ that are configured to receive and filter and/or regulate a received modulator voltage $V_{MOD}$ to provide a filtered and/or regulated modulator voltage in the form of a supply voltage $V_{SUPPLY\ \#1\text{-}n}$. The system 100 includes a plurality of power amplifiers 110$a$-$n$ that are configured to receive the supply voltage $V_{SUPPLY\ \#1\text{-}n}$ based on the operation of the supply modulators 106$a$-$n$. One or more aspects of signal processing and control for the system 100 are omitted from FIG. 1.

Figure 2:
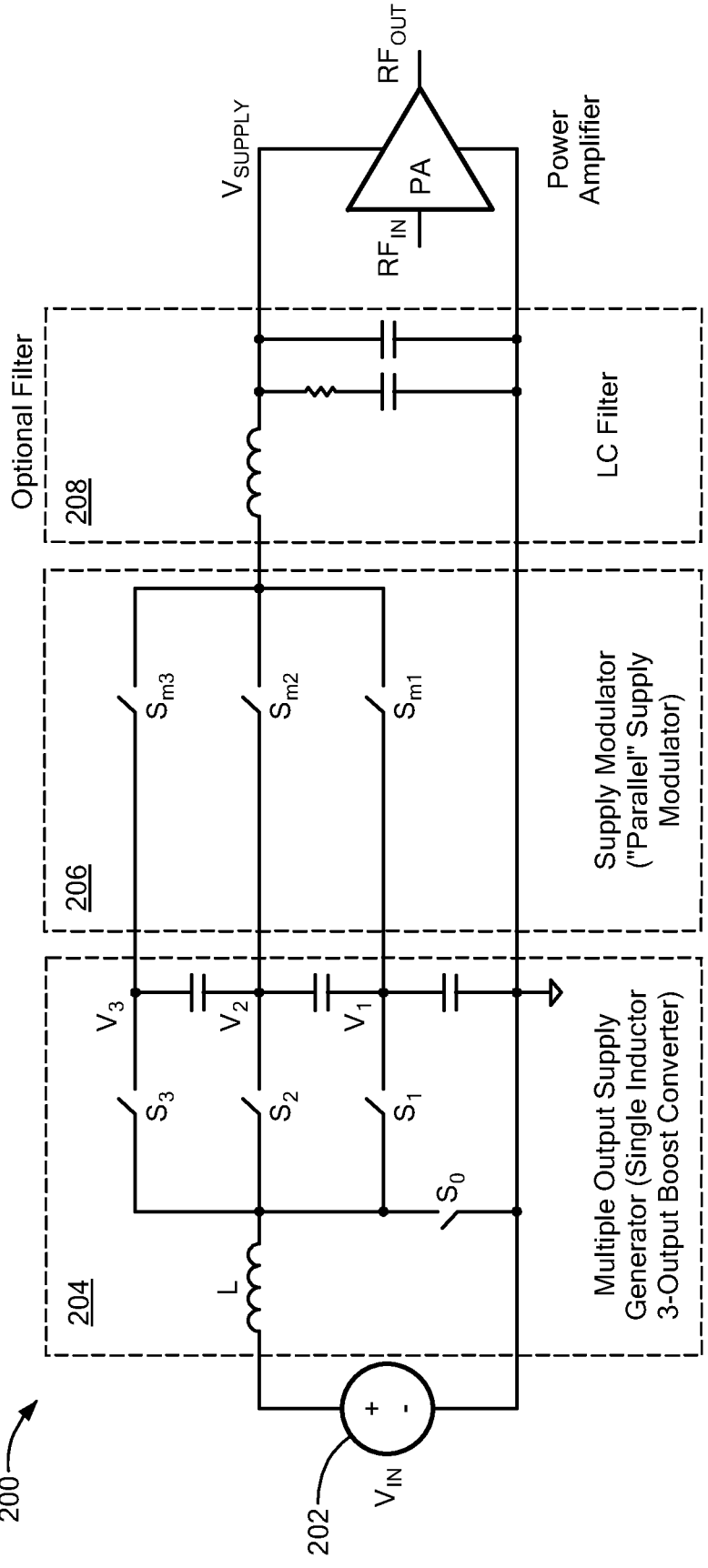
FIG. 2 is a schematic diagram of an exemplary rf power amplifier system including a supply generator, a supply modulator, and an optional filter.

Referring to FIG. 2, an exemplary rf power amplifier system 200 includes a single-inductor multiple-output boost converter as a supply generator 204 that is configured to receive power from an energy source 102, a parallel supply modulator 206, and an optional LC filter 208. The supply modulator 206 provides one of the supply voltages $V_{1\text{-}3}$ to a power amplifier 210 based on operation of the supply modulator 206.

The supply generator 104, 204 of FIGS. 1 and 2 can be configured to synthesize multiple power supply voltages from a single input source, and in some implementations, regulate one or more of those power supply voltages. The supply modulators 106$a$-$n$, 206 can be configured to rapidly switch among the power supply voltages provided by the supply generators 104, 204 to provide a supply voltage to the rf amplifiers 110$a$-$n$, 210. As described above, in some implementations, the supply modulators 106$a$-$n$, 206 are configured to provide a modulator voltage that is filtered and/or regulated by the optional filtering and/or regulation circuitry 108$a$-$n$ and the optional LC filter 208.

In accordance with the concepts, systems, circuits, and techniques described herein, it has been recognized that the manner in which the supply generators and the supply modulators are best realized may depend upon the power level, voltage level, and application space of the rf amplifier system. It is notable, however, that for many mobile applications, it may be desirable to monolithically integrate electronic elements of both the supply generator and supply modulator as well as portions of ancillary circuits on a single semiconductor die (e.g., in a CMOS or BCD process), and in some cases it may be desirable to integrate these electronics together with power amplifiers on a single die. In all cases, however, efficient drive of the switches involved in supply generation, supply modulation, and ancillary networks is valuable to achieving a small, high-performance design.

Supply generators can be realized through a variety of methods. Supply generators have been realized using multiple separate converters, multiple-output magnetic converters, multiple-output switched-capacitor converters, hybrid magnetic/switched-capacitor converters providing a ratiometric set of output voltages, and hybrid magnetic/switched-capacitor converters providing differential capacitive energy transfer for related but non-ratiometric distribution of discrete supply voltages.

In some implementations, one or more ancillary networks can be associated with the supply modulators described herein, including switching elements associated with the connection of the supply modulator outputs to one or more loads (e.g., a power amplifiers). The one or more ancillary networks can include: (1) connection switching networks that enable one or more on-die supply modulator outputs to be routed to one or more power amplifier outputs; (2) one or more switchable filter components for adjusting filtering of a provided modulator output; and/or (3) one or more turn-off switches to enable a supply modulator output to be disconnected from a power amplifier and/or filter.

Figure 3:
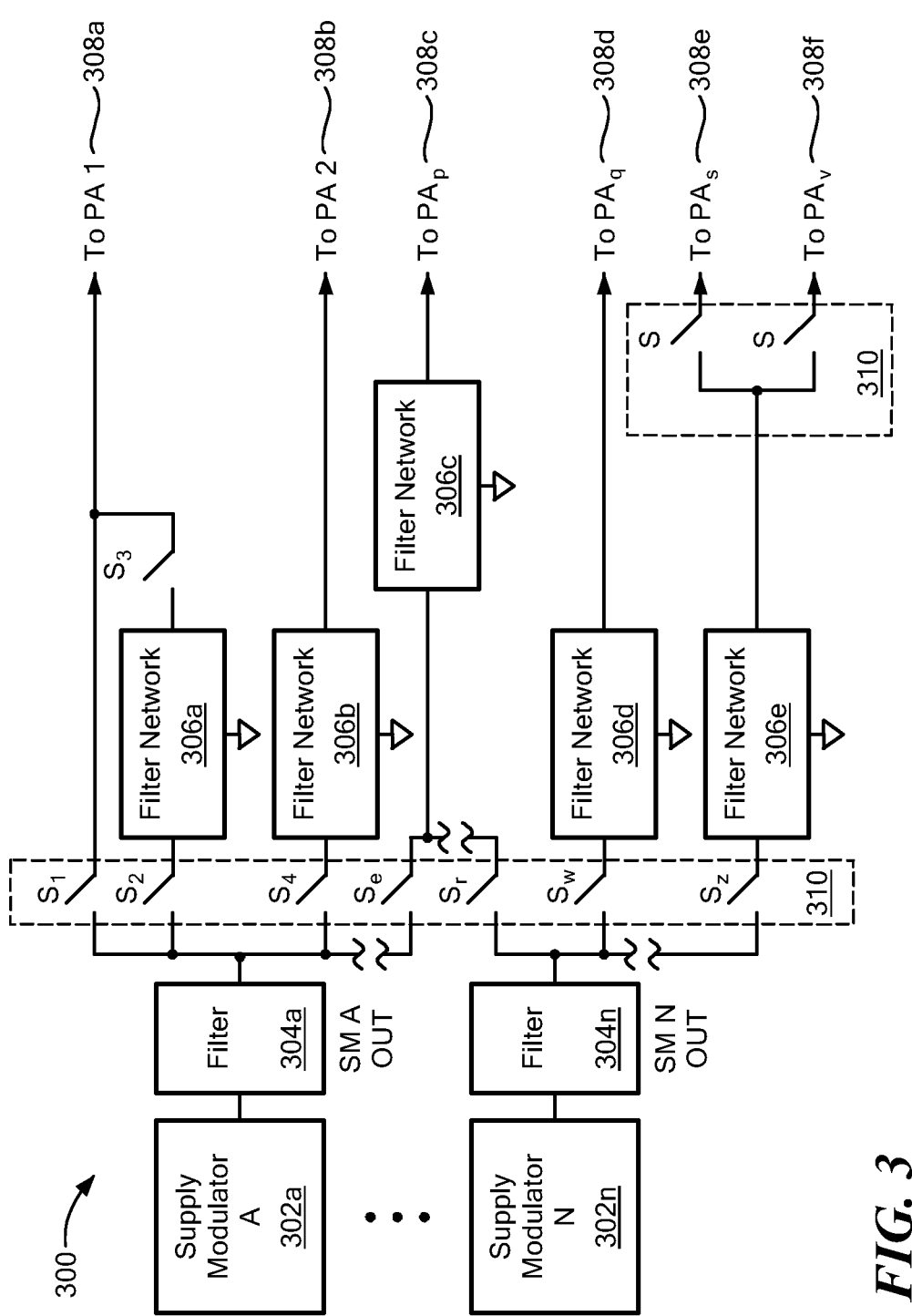
FIG. 3 is a block diagram of a portion of an exemplary rf power amplifier system including filter networks connected by switches to supply modulators.

Referring to FIG. 3, a portion of an exemplary rf power amplifier system 300 includes a plurality of supply modulators 302$a$-$n$ that are configured to provide supply voltages to a plurality of power amplifiers 308$a$-$f$ via a plurality of filters 304$a$-$n$ and a plurality of filter networks 306$a$-$e$. The filters 304$a$-$n$, the filter networks 306$a$-$e$, and power amplifiers 308$e$-$f$ are coupled to a switch network 310 that includes a plurality of switches. The filters 304$a$-$n$ and the filter networks 306$a$-$e$ are sometimes collectively referred to herein as "filter circuitry."

The filter circuitry is configured to receive and filter modulator voltages $V_{MOD}$ provided by the respective supply modulators 302$a$-$n$ to provide filtered and/or regulated modulator voltages in the form of supply voltages $V_{SUPPLY\ \#1\text{-}6}$. The switch network 310 operates to cause the filters 304$a$-$n$ and selected ones of the filter networks 306$a$-$e$ to filter and/or regulated the modulator voltages $V_{MOD}$ such that a desired supply voltage $V_{SUPPLY\ \#1\text{-}6}$ with the desired regulation and/or filtering is provided to the power amplifiers 308$a$-$f$. For example, the switch network 310 can be used to route individual modulator voltages $V_{MOD}$ to one or more of the power amplifiers 308$a$-$f$, to enable filter, energy storage, or pulse-shaping networks, including filter networks 306$a$-$e$, to be connected or disconnected, to enable the characteristics of filter networks 306$a$-$e$ to be dynamically reconfigured, and/or to enable paralleling of multiple supply modulators to drive a single output.

In some implementations, the filter networks 306$a$-$e$ can include pulse-shaping networks, linear regulators, etc., to filter and/or regulate the modulator voltages $V_{MOD}$ and provide the supply voltages $V_{SUPPLY\ \#1\text{-}6}$. Pulse-shaping networks necessarily include magnetic components such as inductors to provide high-efficiency filtering. Inductors can pose a challenge to realizing highly miniature discrete drain modulation systems and pulse-shaping networks in particular because they are relatively large and costly components.

Figure 4:
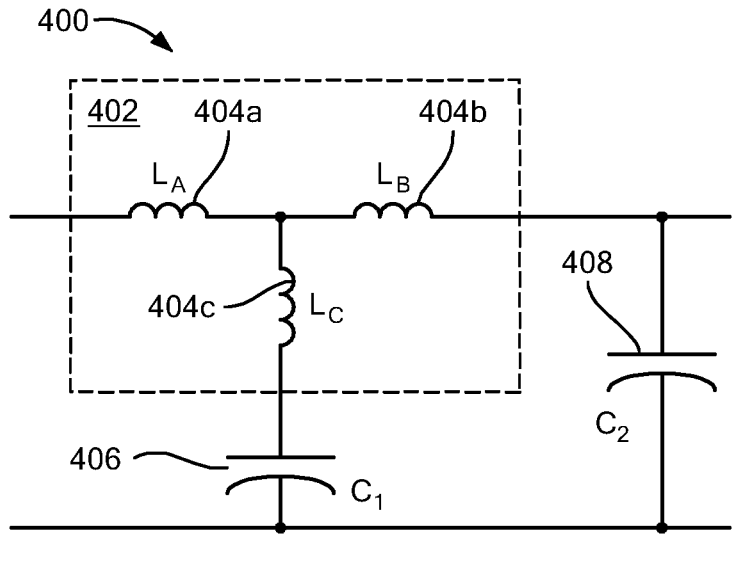
FIG. 4 is a schematic diagram of a prior art pulse-shaping network that includes a "T" connection of inductors.

Referring to FIG. 4, a prior art pulse-shaping network 400 includes a T connection 402 of inductors 404$a$-$c$, a capacitor 406 connected to the inductor 404$c$, and a capacitor 408 connected to the inductor 404$b$ and the capacitor 406 In this pulse-shaping network 400, the inductor 404$c$ and the capacitor 406 are configured to help provide a transmission null at a frequency of interest in a transfer characteristic, while the inductors 404$a$, 404$b$ are configured to help with an overall low-pass characteristic. One disadvantage to the pulse-shaping network 400 is that it includes three inductors 404$a$-$c$, and inductors are relatively large and lossy electronic components.

Figure 5:
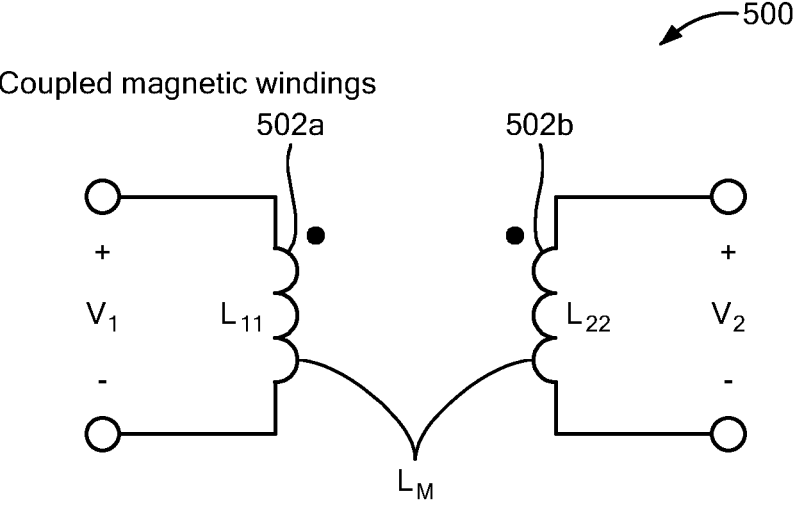
FIG. 5 is a schematic diagram of an exemplary magnetic structure including coupled magnetic windings provided in accordance with the concepts described herein.

FIG. 5 shows an exemplary magnetic structure 500 that can be included in a pulse-shaping network to provide the same or improved functionality relative to the prior art pulse-shaping network 400 of FIG. 4. The magnetic structure 500, which includes coupled magnetic windings 502a-b, is smaller than the inductors 404a-c of the T connection 402. As such, the magnetic structure 500 can provide improved functionality while allowing the overall size of the pulse-shaping network to be reduced. Improved functionality may include reduced loss/improved efficiency (e.g., at a given size) and the ability to synthesize a negative effective inductance in one branch of the equivalent T network if desired, which is not possible with uncoupled discrete inductors.

Figures 6A, 6B:
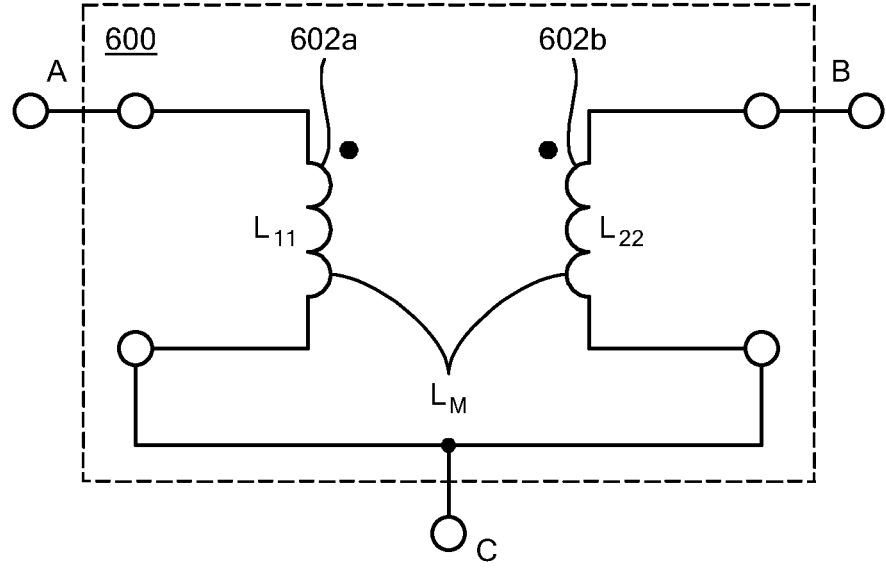
FIG. 6A is a schematic diagram showing exemplary electrical coupling of a magnetic structure including coupled magnetic windings provided in accordance with the concepts described herein.
FIG. 6B is a schematic diagram of an equivalent circuit model of the magnetic structure of FIG. 6A.

FIG. 6A shows exemplary electrical coupling of a magnetic structure 600 that includes coupled magnetic windings 602a-b. For example, the magnetic structure 500 of FIG. 5 may be electrically coupled in the manner illustrated in FIG. 6A. FIG. 6B shows an equivalent circuit model of the magnetic structure 600 of FIG. 6A.

Referring again to FIG. 5, the coupled magnetic windings 502a-b are magnetically coupled. A first of the coupled magnetic windings 502a exhibits a self-inductance $L_{11}$, a second of the coupled magnetic windings 502b exhibits a self-inductance $L_{22}$, and the two coupled magnetic windings 502a-b together have a mutual inductance $L_M$ with the polarity indicated in FIG. 5. In some implementations, the coupled magnetic windings 502a-b is implemented as inductors.

The magnetic structure 500 can be described with an inductance matrix as follows:

$$\begin{bmatrix} v_1 \\ v_2 \end{bmatrix} = \begin{bmatrix} L_{11} & L_M \\ L_M & L_{22} \end{bmatrix} \begin{bmatrix} \dfrac{di_1}{dt} \\ \dfrac{di_2}{dt} \end{bmatrix}$$

According to the inductance matrix, fundamental physics requires that:

$$|L_M| \leq \sqrt{L_{11}L_{22}}.$$

If the magnetic structure 500 is electrically connected as show in FIG. 6A, with external terminals A, B, and C, the magnetic structure 500 can be represented with the equivalent circuit model 610 shown in FIG. 6B, with the parameters $L_A$, $L_B$, and $L_C$ in terms of self-inductance $L_{11}$, $L_{22}$ and mutual inductance $L_M$ of the coupled magnetic windings 502a-b, in which $L_A = L_{11} - L_M$, $L_B = L_{22} - L_M$, and $L_C = L_M$. Thus, using a single magnetic structure 500 having coupled magnetic windings 502a-b that are appropriately magnetically coupled, the electrical terminal behavior of three inductors in a T structure can be replicated while achieving the improved functionality described above. Such a magnetic structure 500 can be employed in a pulse-shaping network at smaller size than if one implemented three separate inductors as is conventionally done, for example, as shown in the prior art pulse-shaping network 400 of FIG. 4.

In some implementations, alternative (e.g., opposite) coupling may be employed such that:

$$L_A = L_{11} + |L_M|, L_B = L_{22} = |L_M|, \text{ and } L_C = -|L_M|.$$

Figure 9:
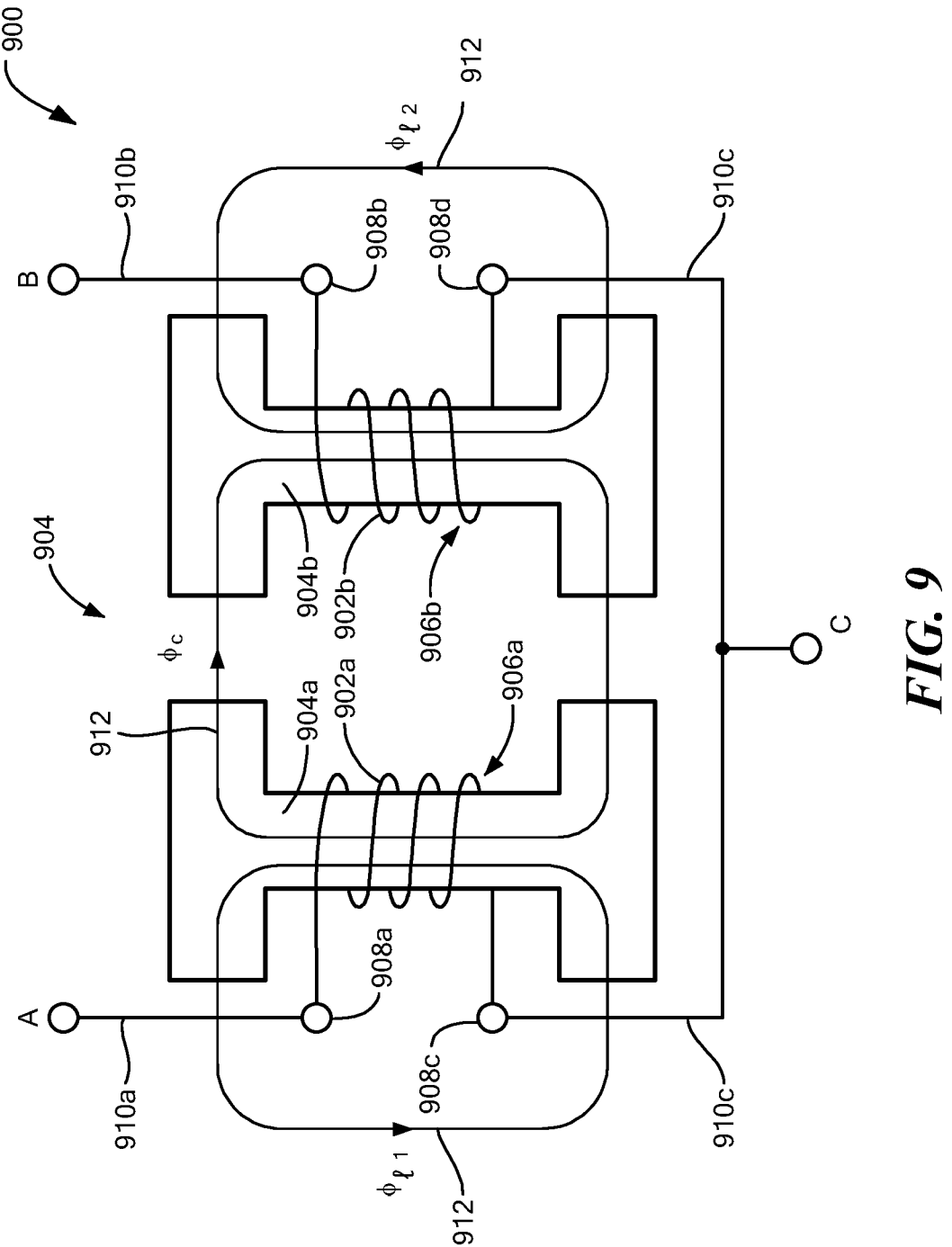
FIG. 9 is a representation of the magnetic structure of FIG. 6A including an exemplary two-piece magnetic core arrangement provided in accordance with the concepts described herein.
Figure 10:
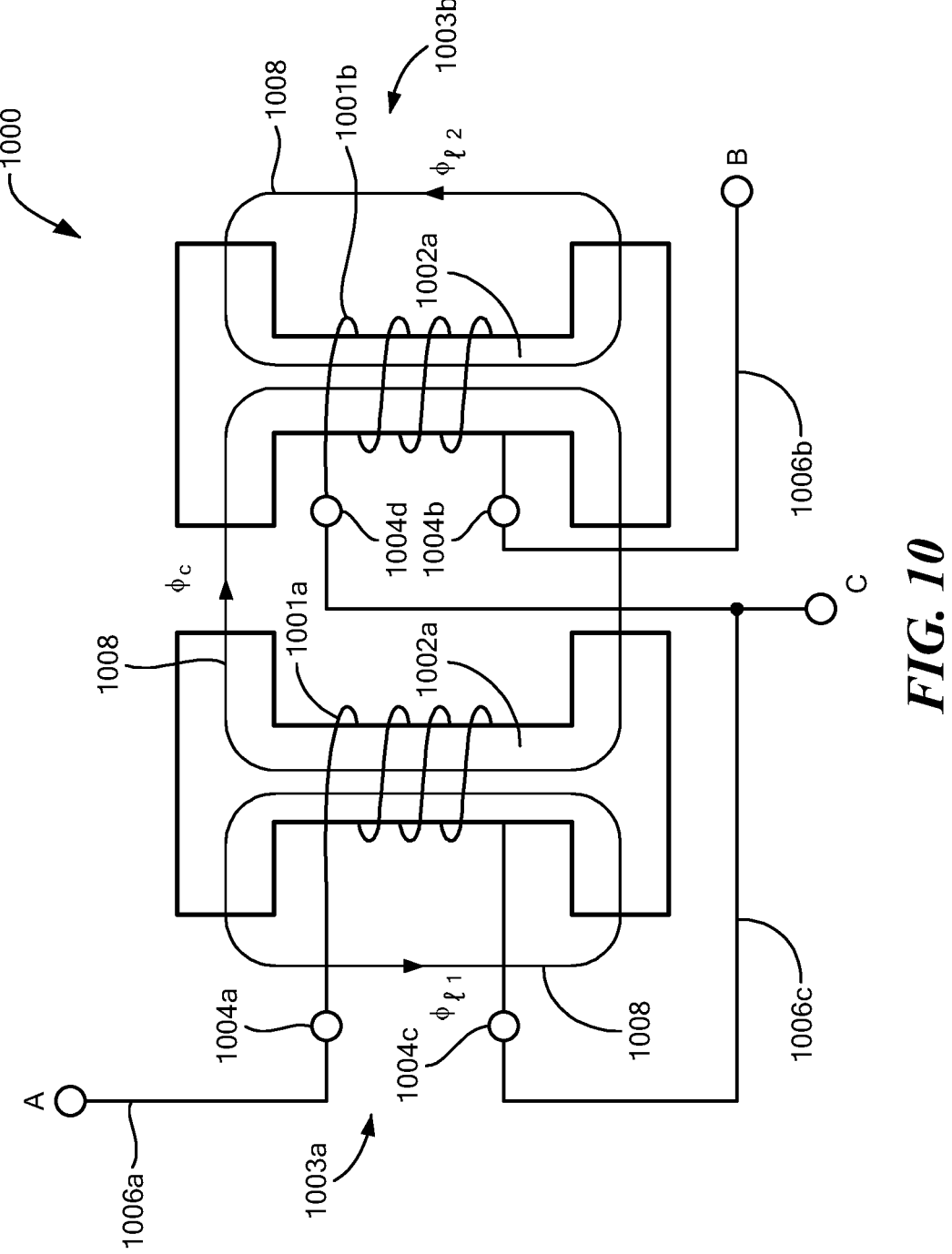
FIG. 10 is a representation of an exemplary magnetic structure having an alternate electrical coupling arrangement provided in accordance with the concepts described herein.

The sign of the $L_C$ term may depend on the particular arrangement used for a coupled magnetic element/structure (e.g., the coupled magnetic elements 900 and 1000 of FIGS. 9 and 10). For example, briefly referring to the coupled magnetic element 900 of FIG. 9, the two inductive elements 906a, 906b have opposite winding polarities, thus giving a positive value for $L_C$. However, if the first winding 902a or the second winding 902b were revered such that the polarities of the windings were the same, $L_C$ would have a negative value. Similarly, briefly referring to the coupled magnetic element 1000 of FIG. 10, the two inductive elements 1003a, 1003b have identical winding polarities, thus giving a negative value for $L_C$. However, if one of the windings 1001a, 1001b were reversed such that the polarities of the windings were opposite, $L_C$ would have a positive value.

Figure 7A:
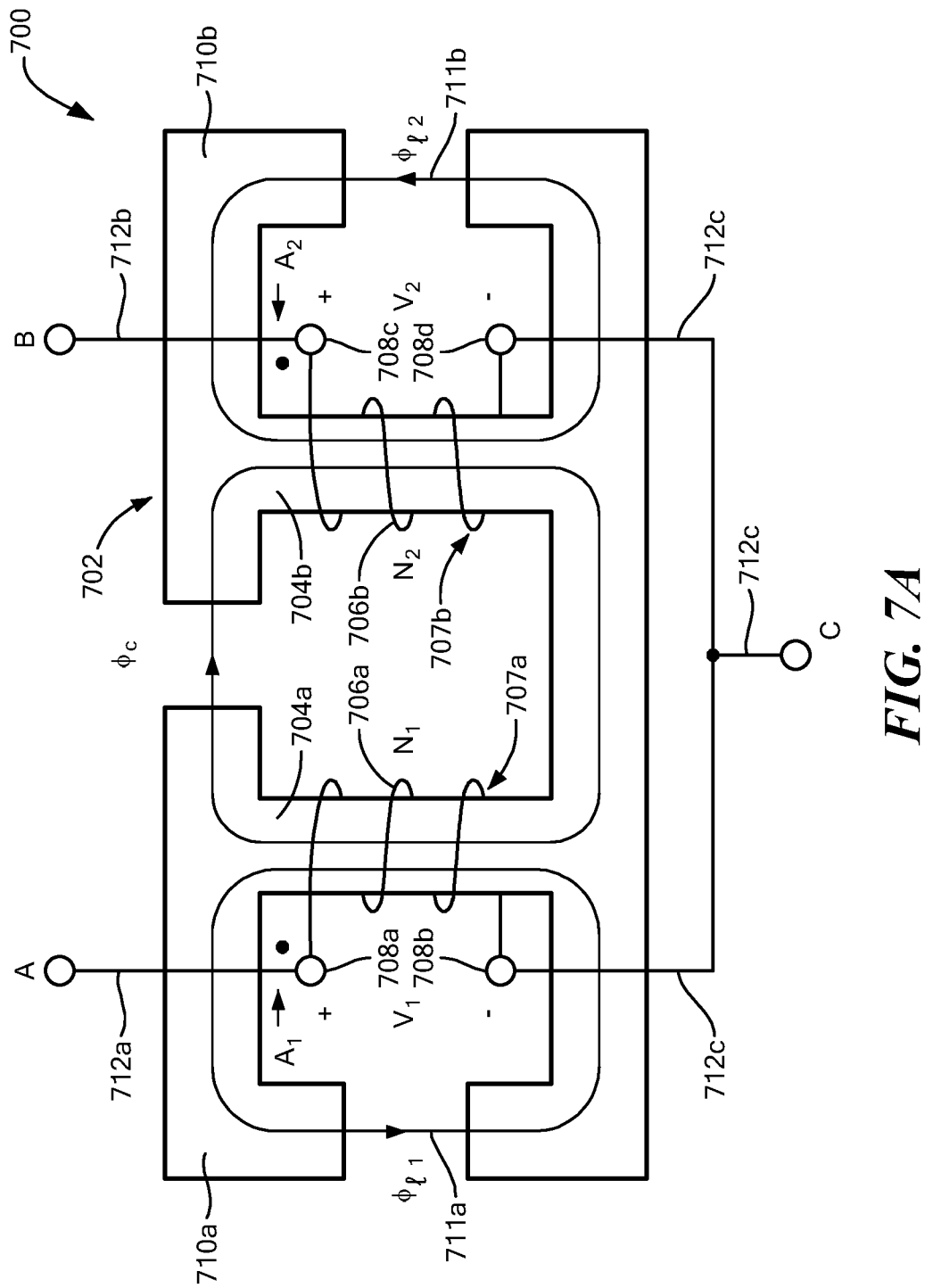
FIGS. 7A and 7B are representations of the magnetic structure of FIG. 6A including exemplary single-piece magnetic core arrangements provided in accordance with the concepts described herein.

Referring to FIG. 7A, the magnetic structure 600 of FIG. 6A is realized (or represented) as a magnetic structure 700 comprising a single-piece magnetic core 702 having first and second central legs 704a, 704b. A first winding 706a with N1 turns is disposed about first leg 704a and configured to provide a first inductive element 707a having first and second external terminals 708a, 708b. A second winding 706b having N2 turns is disposed about second leg 704b and configured to provide a second inductive element 707b having third and fourth external terminals 708c, 708d. Single-piece magnetic core 702 further comprises third and fourth outer legs 710a, 710b having air gaps provided therein. Relevant magnetic flux paths $\Phi_{l1}$, $\Phi_{l2}$, $\Phi_c$ (identified by reference numerals 711a-711c) are defined by core paths and gaps (e.g., air gaps).

A first signal path 712a has a first end coupled to the external terminal 708a of the first inductive element 707a and a second end coupled to a first output A of the magnetic structure 700. A second signal path 712b has a first end coupled to the external terminal 708c of the second inductive element 707b and a second end coupled to a second output B of the magnetic structure 700. A third signal path 712c has a first end coupled to external terminal 708b of the first inductive element 707a and a second end coupled to the external terminal 708d of the second inductive element 707b. Third signal path 712c is also coupled to a third output C of the magnetic structure 700.

Figure 7B:
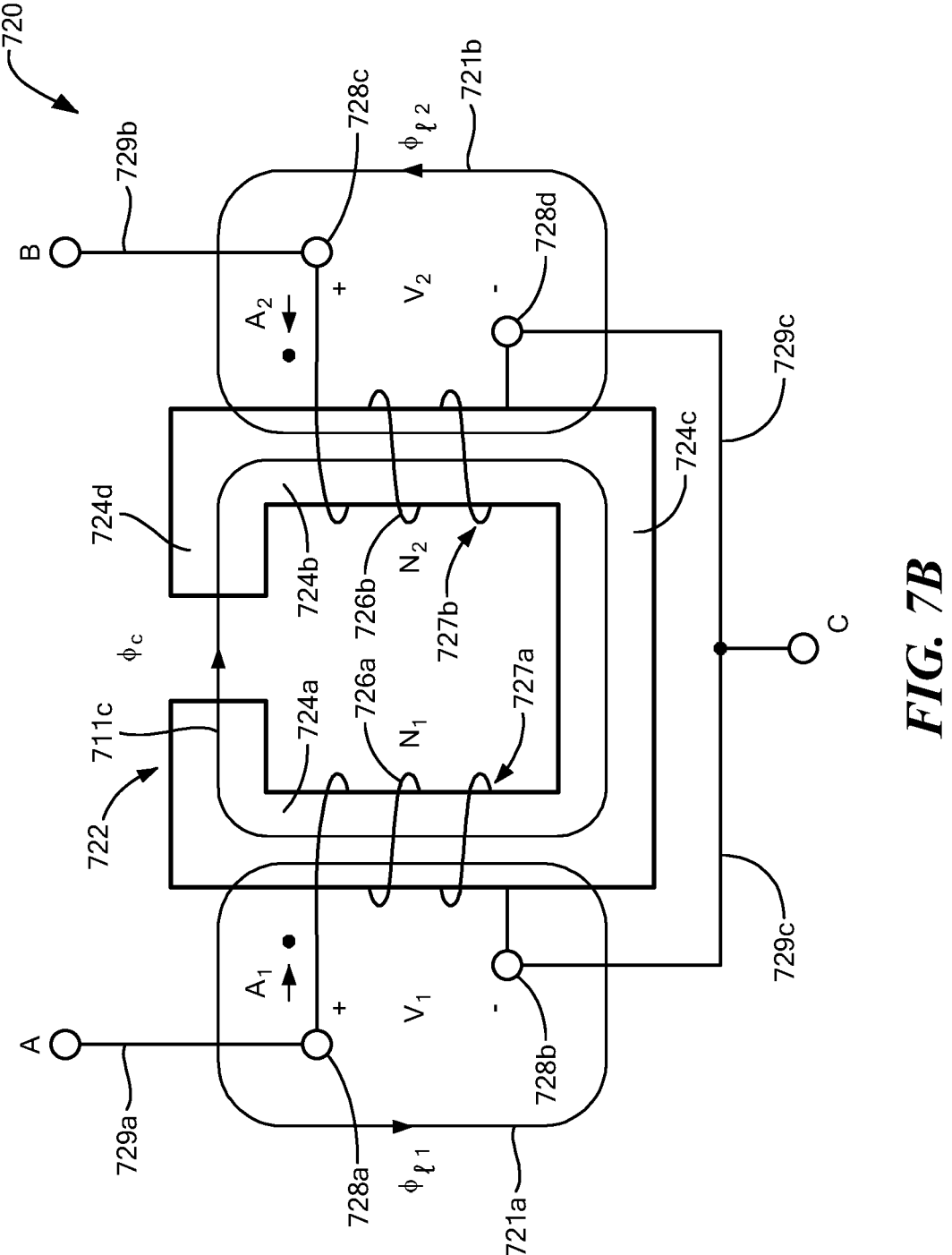

Referring to FIG. 7B, a magnetic structure 720 illustrates another embodiment of a circuit realization of the magnetic structure 600 of FIG. 6A. This example embodiment comprises a single-piece magnetic core 722. Two of the relevant magnetic flux paths $\Phi_{l1}$, $\Phi_{l2}$ 721a, 721b are defined by leakage paths outside of the core 722. In this embodiment, the single-piece magnetic core 722 has first and second opposing legs 724a, 724b and third and fourth opposing legs 724c, 724d with the fourth leg 724d having an air gap provided therein and the first, second, third and fourth legs 724a-d coupled to form a closed (e.g., toroidal) shape. A first winding 726a having N1 turns is disposed about a portion of the first leg 724a and configured to provide a first inductive element 727a having first and second external terminals 728a, 728b of the magnetic structure 720. A second winding 726b having N2 turns is disposed about a portion of the second leg 724b and configured to provide a second inductive element 727b having third and fourth external terminals 728c, 728d of the magnetic structure 720. A first signal path 729a has a first end coupled to the first external terminal 728a of the first inductive element 727a and a second end coupled to a first output A of the magnetic structure 720. A second signal path 729b has a first end coupled to external terminal 728c of the second inductive element 727b and a second end coupled to a second output B of the magnetic structure 720. A third signal path 729c has a first end coupled to external terminal 728b of the first inductive element 727a and a second end coupled to external terminal 728d of the second inductive element 727b. The third signal path 729c is also coupled to a third output C of the magnetic structure 720.

Figure 8:
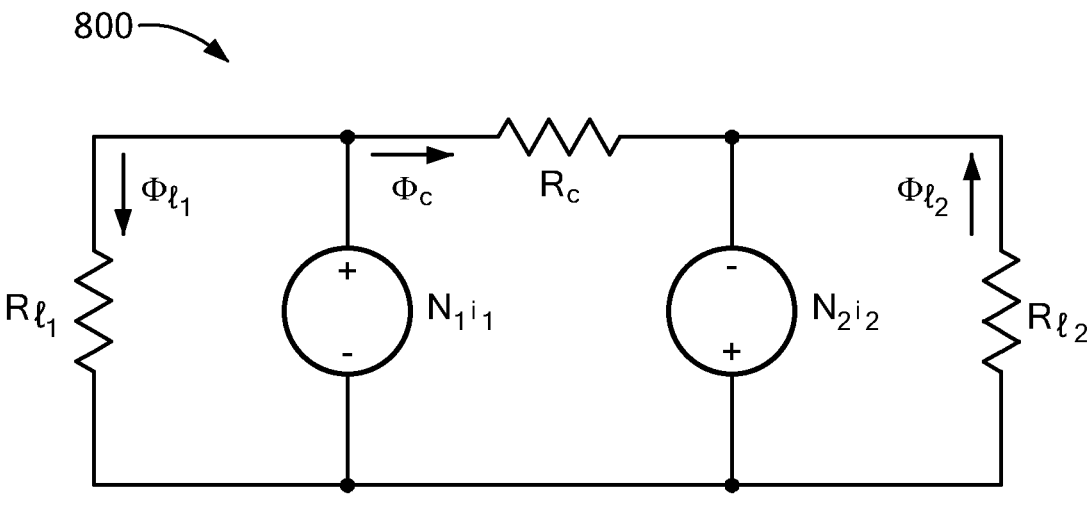
FIG. 8 is a schematic diagram of an exemplary magnetic circuit model that corresponds to the magnetic structure of FIG. 6A.

Referring to FIG. 8, a magnetic circuit model 800 is presented that corresponds to the magnetic structure 600 of FIG. 6A and the example embodiments of FIGS. 7A, 7B. According to the magnetic circuit model 800, the magnetic fluxes $\Phi_c$, $\Phi_{l1}$, and $\Phi_{l2}$ and flux linkages $\lambda_1=N_1(\Phi_c-\Phi_{l1})$ and $\lambda_2=N_2(\Phi_c+\Phi_{l2})$ of the two coupled magnetic windings 602a-b are determined by the currents $i_1$ and $i_2$ into terminals A and B, the numbers of turns $N_1$ and $N_2$ of the coupled magnetic windings 602a-b, and the net reluctances of the magnetic paths $\mathcal{R}_c$, $\mathcal{R}_{l1}$, and $\mathcal{R}_{l2}$. Based on this model, the following self and mutual inductances are provided: $L_{11}=(N_1^2/\mathcal{R}_c+N_1^2/\mathcal{R}_{l1})$, $L_{22}=(N_2^2/\mathcal{R}_c+N_2^2/\mathcal{R}_{l2})$, and $L_M=N_1N_2/\mathcal{R}_c$. Thus, by setting an appropriate number of turns $N_1$ and $N_2$ and reluctances of the different paths, desired self and mutual inductances can be achieved to corresponds to a desired set of parameters that correspond to a T connection.

Exemplary values of the inductance values in the T connection 402 of FIG. 4 in a pulse-shaping network may be about $L_A=7$ nH, $L_B=7$ nH, and $L_C=2$ nH. These values can be realized with the magnetic structure 600 including the coupled magnetic windings 602a-b as in FIG. 6A, with values of about $L_{11}=9$ nH, $L_{22}=9$ nH, and $L_M=2$ nH. These values of self and mutual inductance can be easily realizable within physical bounds using a variety of physical structures.

In some implementations, it may be desirable to realize the coupled magnetic windings 602a-b as a component fabricated on a single magnetic core piece (e.g., as shown in FIGS. 7A and 7B). In some implementations, it may be desirable to realize the coupled magnetic windings 602a-b as windings on a nonmagnetic core or as traces in a module or printed circuit substrate. In some implementations, it may be desirable to realize the coupled magnetic windings 602a-b using multiple magnetic cores pieces.

In some implementations, the coupled magnetic windings 602a-b can be realized using two separately-constructed inductors that are placed in close physical proximity and physically positioned such that they couple the desired degree of magnetic flux, and are further electrically connected to achieve the desired behavior of the T connection. The two inductors could, for example, be positioned with controlled spacing on a module, printed circuit board, or integrated circuit substrate holding the pulse-shaping network, with electrical interconnect in the module traces. By implementing a magnetic structure with two coupled magnetic windings, behavior usually implemented with three inductors can be achieved while only requiring two physical inductors, and improved energy storage and/or filtering capability can be achieved from given component sizes. Moreover, arrangements using coupled magnetic windings can have the benefits of allowing standard, high-production-volume miniaturized inductor components to be used in constructing the magnetic structure, and enabling the degree of coupling to be controlled or tuned by the physical placement of the two inductors. Precise control over the degree of coupling can be manageable using modern "pick and place" equipment in component positioning, for example, and can also be controlled by hand-mounting the components or through other assembly methods. The two inductors could also be placed on their own special substrate with controlled spacing, and that special substrate could in turn be mounted on the substrate holding the pulse-shaping network.

Referring to FIG. 9, a coupled magnetic element 900 comprises two windings 902a, 902b disposed about respective ones of cores 904a, 904b to form respective inductive elements 906a, 906b disposed in close proximity. By close proximity it is meant close enough such that there exists flux that links both windings 902a, 902b (and ideally significant flux that links both windings 902a, 902b). The coupled magnetic element 900 has the magnetic circuit model shown in FIG. 8.

Coupled magnetic element 900 has external terminals 908a-908d. Signal paths 910a, 910b have respective first ends coupled to respective ones of external terminals 908a, 908b and respective second ends coupled to respective ones of output terminals A, B of the coupled magnetic element 900. Signal path 910c interconnects external terminals 908c, 908d and leads to output terminal C of the coupled magnetic element 900. Flux paths are represented with lines identified with reference numeral 912. In this construction, the inductive elements 906a, 906b are wound with opposite sense to achieve positive $L_M$. In many designs, the two indicative elements 906a, 906b may be identical.

The embodiment of FIG. 9 thus illustrates an example of the magnetic structure 600 of FIG. 6A as including a two-piece magnetic core (generally denoted 904) including a first winding 902a and a second winding 902b with the windings 902a, 902b provided on separate magnetic core pieces 904a, 904b to provide inductive elements 906a, 906b. The two inductive elements 906a, 906b may, for example, be wire-wound dumbbell inductors or similar solenoid inductor constructions having magnetic or non-magnetic cores. The inductive elements 906a, 906b could also have other physical structures and/or be fabricated through other techniques as is known in the industry.

The electrical coupling between the inductive elements 906a, 906b to create the coupled magnetic element 900 may be fabricated using any additive or subtractive printed circuit techniques or through other fabrication techniques as known in industry. For the structure and interconnect pattern shown in FIG. 9, realizing positive mutual inductance requires that the two inductive elements 906a, 906b have opposite winding polarities as shown. Negative mutual inductance could be realized by using the same winding polarity on the inductive elements 906a, 906b.

Referring to FIG. 10, a coupled magnetic element (or structure) 1000 comprises two windings 1001a, 1001b disposed about respective ones of cores 1002a, 1002b which form inductive elements 1003a, 1003b disposed in close proximity. By close proximity it is meant close enough such that there exists flux that links both windings 1001a, 1001b (and ideally significant flux that links both windings). Windings 1001a, 1001b are provided having identical winding polarities. The coupled magnetic element 1000 has the magnetic circuit model shown in FIG. 8. The coupled magnetic element 1000 has external terminals 1004a-1004d. Signal paths 1006a, 1006b have respective first ends coupled to respective ones of terminals 1004a, 1004b and respective second ends coupled to respective ones of output terminals A, B of the coupled magnetic element 1000. Signal path 1006c interconnects external terminals 1004c, 1004d and leads to output terminal C of the coupled magnetic element. Flux paths are represented with lines identified with reference numeral 1008. In this construction, the inductive elements 1003a, 1003b are wound with identical sense to achieve positive $L_M$. In many designs, the two inductive elements 1003a, 1003b may be identical.

With this arrangement, positive mutual inductance can be realized with two inductive elements 1003a, 1003b having identical winding polarities. In some implementations, the two inductive elements 1003a, 1003b may be identical components. Magnetic flux paths including that linking the windings of the two components are illustrated as $\Phi_{l1}$, $\Phi_{l2}$, and $\Phi_c$.

Using the concepts, systems, devices, structures, and techniques described herein, miniaturized inductor components can be used to construct pulse-shaping networks (including capacitors and other filter elements) and configuration elements (such as switches) with the elements all mounted on a single substrate (e.g., a module). Supply modulator and/or power amplifiers could be mounted on the same substrate (e.g., within the same module), or portions or all of the pulse-shaping network (including the coupled magnetic windings) could be placed on a first substrate and connected to further elements on a second substrate.

Although reference is sometimes made herein to particular materials, it is appreciated that other materials having similar functional and/or structural properties may be substituted where appropriate, and that a person having ordinary skill in the art would understand how to select such materials and incorporate them into embodiments of the concepts, techniques, and structures set forth herein without deviating from the scope of those teachings.

Various embodiments of the concepts, systems, devices, structures and techniques sought to be protected are described herein with reference to the related drawings. Alternative embodiments can be devised without departing from the scope of the concepts, systems, devices, structures and techniques described herein. It is noted that various connections and positional relationships (e.g., over, below, adjacent, etc.) are set forth between elements in the following description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. As used herein, the terms "comprises," "comprising, "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e.

two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal, "top," "bottom," and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

What is claimed is:

1. A pulse-shaping network configured for use in a radio frequency (rf) power amplifier system, the pulse-shaping network comprising:

a coupled magnetic element comprising a first inductive element magnetically coupled to a second inductive element;

the first inductive element comprising a first winding disposed about a first portion of a core; and the second inductive element comprising a second winding disposed about a second portion of a core, wherein the first and second inductive elements are coupled to provide a T network having a first branch having an inductance corresponding to the inductance of the first inductive element and a mutual inductance of the first and second inductive elements, a second branch having an inductance corresponding to the inductance of the second inductive element and a mutual inductance of the first and second inductive elements, and a third branch having an inductance corresponding to the mutual inductance between the first and second inductive elements and polarities of the first and second windings.

2. The pulse-shaping network of claim 1, wherein the coupled inductive elements realize equivalent functionality to that provided from a circuit comprising three positive-valued inductors coupled in a T configuration.

3. The pulse-shaping network of claim 1, wherein the coupled inductive elements realize equivalent functionality to that provided from a circuit comprising two positive-valued inductors and one negative-valued inductor coupled in a T configuration.

4. The pulse-shaping network of claim 1, wherein the core is a single-piece core comprising the first and second portions.

5. The pulse-shaping network of claim 4, wherein the single-piece core is magnetic.

6. The pulse-shaping network of claim 1, wherein the coupled magnetic element has three output terminals and comprises:

a single magnetic core having a pair of central legs and a pair of outer legs with one of the outer legs having an air gap provided therein;

the first winding is disposed about a portion of a first one of the pair of central legs and configured to provide first and second external terminals of the first inductive element;

the second winding is disposed about a portion of a second one of the pair of central legs and configured to provide third and fourth external terminals of the second inductive element;

a first signal path having a first end coupled to the first external terminal of the first inductive element and a second end coupled to a first one of the three output terminals of the coupled magnetic element;

a second signal path having a first end coupled to the third external terminal of the second inductive element and a second end coupled to a second one of the three output terminals of the coupled magnetic element; and a third signal path having a first end coupled to the second external terminal of the first inductive element and a second end coupled to the fourth external terminal of the second inductive element, and the third signal path coupled to a third one of the three output terminals of the coupled magnetic element.

7. The pulse-shaping network of claim 1, wherein the coupled magnetic element has three output terminals and comprises:

a single magnetic core having first and second opposing legs and third and fourth opposing legs with the fourth leg having an air gap provided therein and the first, second, third, and fourth legs coupled to form a closed shape;

the first winding disposed about a portion of the first leg and configured to provide first and second external terminals of the first inductive element;

the second winding disposed about a portion of the second leg and configured to provide third and fourth external terminals of the second inductive element;

a first signal path having a first end coupled to the first external terminal of the first inductive element and a second end coupled to a first one of the three output terminals of the coupled magnetic element;

a second signal path having a first end coupled to the third external terminal of the second inductive element and a second end coupled to a second one of the three output terminals of the coupled magnetic element; and a third signal path having a first end coupled to the second external terminal of the first inductive element and a second end coupled to the fourth external terminal of the second inductive element, and the third signal path coupled to a third one of the three output terminals of the coupled magnetic element.

8. The pulse-shaping network of claim 1, wherein the core comprises separate core pieces with the first portion of the core corresponding to a first core piece and the second portion of the core corresponding to a second core piece.

9. The pulse-shaping network of claim 8, wherein the first and second windings are wound in opposite directions.

10. The pulse-shaping network of claim 8, wherein the first and second windings are wound in the same direction.

11. The pulse-shaping network of claim 10, wherein the first and second core pieces and associated windings are identical.

12. The pulse-shaping network of claim 1, wherein the coupled magnetic element has three output terminals and comprises:

a first core having the first winding disposed thereon with a first end of the first winding coupled to a first one of the output terminals of the coupled magnetic element and a second end of the first winding coupled to a third one of the output terminals of the coupled magnetic element;

a second, separate core spaced a predetermined distance from the first core and having the second winding disposed thereon with a first end of the second winding coupled to a second one of the output terminals of the coupled magnetic element and a second end of the second winding coupled to the third one of the output terminals of the coupled magnetic element.

13. The pulse-shaping network of claim 12, wherein the first and second windings are wound in opposite directions.

14. The pulse-shaping network of claim 12, wherein the first and second windings are wound in the same direction.

15. The pulse-shaping network of claim 14, wherein the first and second cores and associated windings are identical.

16. The pulse-shaping network of claim 1, wherein the coupled magnetic element has three output terminals and comprises:

a first core having the first winding disposed thereon with a first end of the first winding coupled to a first one of the output terminals of the coupled magnetic element and a second end of the first winding coupled to a third one of the output terminals of the coupled magnetic element;

a second core spaced a predetermined distance from the first core and having the second winding disposed thereon with a first end of the second winding coupled to the third one of the output terminals of the coupled magnetic element and a second end of the second winding coupled to a second one of the output terminals of the coupled magnetic element.

17. The pulse-shaping network of claim 16, wherein the first and second windings are wound in the same direction.

18. The pulse-shaping network of claim 16, wherein the first and second windings are wound in opposite directions.

19. A discrete supply modulation system for providing a varying supply bias voltage to a supply terminal of a radio frequency (RF) amplifier, the discrete supply modulation system comprising:

a power management circuit (PMC) having an input and an output;

an RF amplifier having an RF input, an RF output, and a supply terminal;

a pulse shaping network (PSN) having an input coupled to the PMC and having an output coupled to the supply terminal of the RF amplifier, the PSN comprising a coupled magnetic element, the coupled magnetic element comprising:

a first inductive element magnetically coupled to a second inductive element;

the first inductive element comprising a first winding disposed about a first portion of a core; and the second inductive element comprising a second winding disposed about a second portion of a core, wherein the first and second inductive elements are coupled to provide a T network having a first output terminal having an inductance corresponding to the inductance of the first inductive element and a mutual inductance of the first and second inductive elements; a second output terminal having an inductance corresponding to the inductance of the second inductive element and a mutual inductance of the first and second inductive elements; a third output terminal having an inductance corresponding to the mutual inductance between the first and second inductive elements and polarities of the first and second windings; and wherein the PSN is configured to filter signals resultant from transitions between discrete voltage levels received from the PMC.

20. The discrete supply modulation system of claim 19, wherein the core comprises separate core pieces with the first portion of the core corresponding to a first core piece and the second portion of the core corresponding to a second core piece.

21. A radio frequency (RF) transmit system comprising:

an RF amplifier having an RF input, an RF output, and a supply terminal configured to accept a supply bias voltage signal; and a discrete supply modulation system for providing a varying supply bias voltage to the supply terminal of the RF amplifier, the discrete supply modulation system comprising:

a power management circuit (PMC) having an input and an output;

a pulse shaping network (PSN) having an input coupled to the PMC and having an output coupled to the supply terminal of the RF amplifier, the PSN comprising a coupled magnetic element, the coupled magnetic element comprising:

a first inductive element magnetically coupled to a second inductive element;

the first inductive element comprising a first winding disposed about a first portion of a core; and the second inductive element comprising a second winding disposed about a second portion of a core, wherein the first and second inductive elements are coupled to provide a T network having a first output terminal having an inductance corresponding to the inductance of the first inductive element and a mutual inductance of the first and second inductive elements; a second output terminal having an inductance corresponding to the inductance of the second inductive element and a mutual inductance of the first and second inductive elements; and a third output terminal having an inductance corresponding to the mutual inductance between the first and second inductive elements and polarities of the first and second windings; and wherein the PSN is configured to filter signals resultant from transitions between discrete voltage levels received from the PMC.

22. The rf transmit system of claim 21, wherein the core comprises separate core pieces with the first portion of the core corresponding to a first core piece and the second portion of the core corresponding to a second core piece.

* * * * *